United States Patent [19]
Okazaki et al.

[11] Patent Number: 6,104,123
[45] Date of Patent: Aug. 15, 2000

[54] VIBRATION ACTUATOR HAVING A SUPPORTING MEMBER TO SUPPORT A VIBRATION MEMBER

[75] Inventors: Mitsuhiro Okazaki, Soka; Takatoshi Ashizawa, Yokohama; Kazuyasu Oone, Urawa; Mina Kobayashi, Yokohama, all of Japan

[73] Assignee: Nikon Corporation, Tokyo, Japan

[21] Appl. No.: 09/158,072

[22] Filed: Sep. 22, 1998

[30] Foreign Application Priority Data

Sep. 22, 1997 [JP] Japan ................................. 9-257269
Aug. 17, 1998 [JP] Japan ............................... 10-230493

[51] Int. Cl.⁷ ......................................................... H02N 2/00
[52] U.S. Cl. ........................................ 310/323.09; 310/328
[58] Field of Search ........................... 310/323.09, 323.05, 310/328, 323.04

[56] References Cited

U.S. PATENT DOCUMENTS

| | | | |
|---|---|---|---|
| 5,039,899 | 8/1991 | Yamaguchi | 310/323 |
| 5,101,132 | 3/1992 | Yamaguchi | 310/323 |
| 5,136,200 | 8/1992 | Takizawa et al. | 310/323 |
| 5,140,215 | 8/1992 | Yamaguchi | 310/323 |
| 5,191,688 | 3/1993 | Takizawa et al. | 29/25.35 |
| 5,200,665 | 4/1993 | Iijima | 310/323 |
| 5,416,375 | 5/1995 | Funakubo et al. | 310/323 |
| 5,698,930 | 12/1997 | Takaji | 310/323 |

FOREIGN PATENT DOCUMENTS

| | | | |
|---|---|---|---|
| 63-277477 | 11/1988 | Japan | H02N 2/00 |
| 1-291674 | 11/1989 | Japan | 310/323.09 |
| 2-142366 | 5/1990 | Japan | 310/323.09 |
| 363760 | 1/1978 | U.S.S.R. | 310/328 |
| 614477 | 6/1978 | U.S.S.R. | 310/328 |

OTHER PUBLICATIONS

*Ultrasonic Motors, Theory and Applications*, "Rectangular Plate Motors", §4.5, pp. 131–135 and "Linear Motors" §5.3.6., pp. 191–196, by S. Ueha, et al., Oxford University Press, New York, New York (1993). (English translation attached).

Excerpt from White Series No. 132 "Ultrasonic Motors", ed. Torikeppsu, dated Dec. 20, 1991, pp. 145–146. (English translation attached).

"Piezoelectric Linear Motors for Application to Driving a Light Pick–up Element", Y. Tomikawa, et al., 5th Symposiusm on Dynamics Related to Electromagnetic Force, Collected Papers: Joint Auspices of Japan Mechanical Society, Electrical Society, and Japan AEM Society, Jun. 9–11, 1993, Hitachi City, Japan, pp. 393–398.

*Primary Examiner*—Thomas M. Dougherty

[57] ABSTRACT

A vibration actuator having improved drive efficiency by preventing the generation of noise and unnecessary vibrations. The vibration actuator includes a vibration member to generate vibration in contact with a relative movement member and a supporting member to support the vibration member. The supporting member includes a plurality of position determining members in contact with vibration member at different locations. At least one of the plurality of position determining members provides the vibration member with an energy imparting force.

22 Claims, 13 Drawing Sheets

FIG. 9A
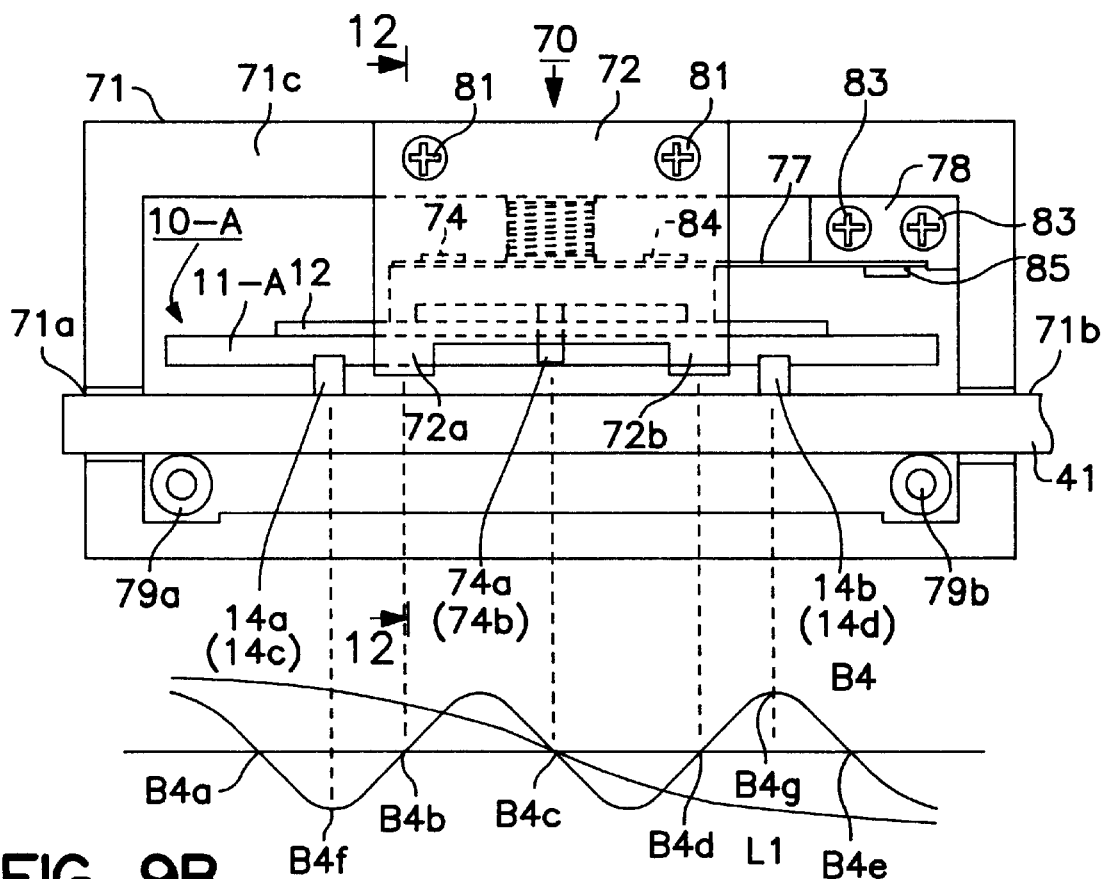
FIG. 9B
FIG. 9C
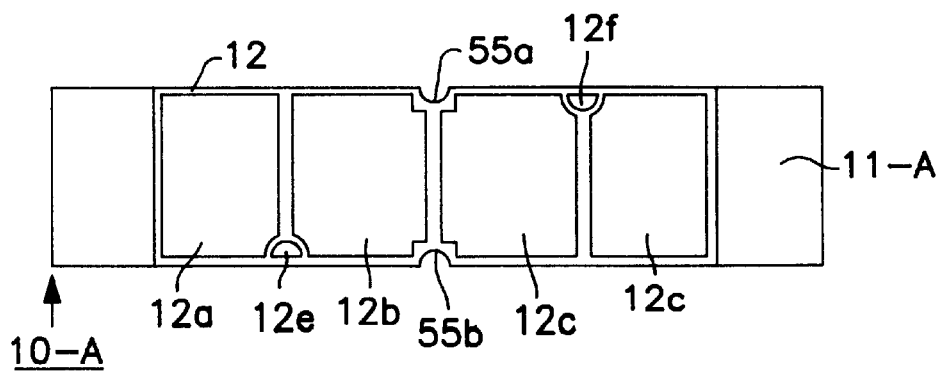

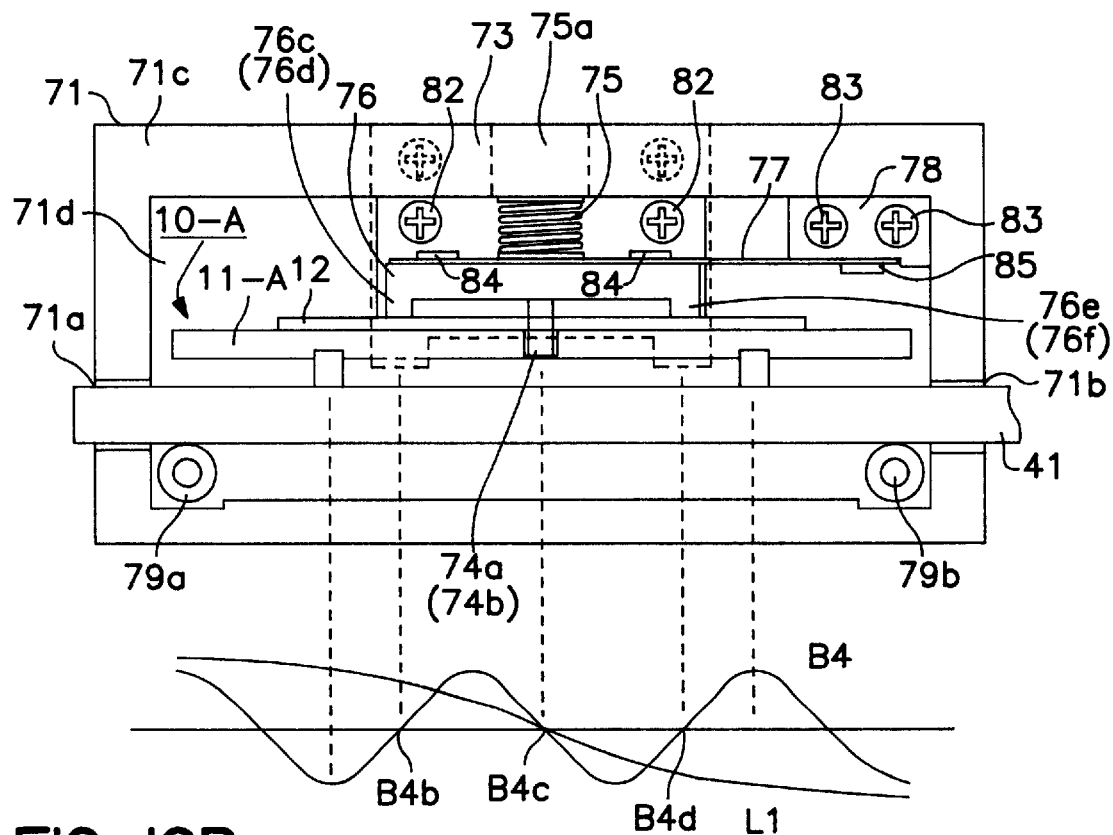

VIBRATION ACTUATOR HAVING A SUPPORTING MEMBER TO SUPPORT A VIBRATION MEMBER

CROSS-REFERENCE TO RELATED APPLICATIONS

This application is based upon and claims priority of Japanese Patent Applications Nos. 09-257269 filed Sep. 22, 1997 and 10-230493 filed Aug. 17, 1998, the contents being incorporated herein by reference.

BACKGROUND OF THE INVENTION

1. Field of the Invention

The present invention relates to a vibration actuator which vibrates to generate a relative movement between a vibration element and a relative moving member. More particularly, the present invention relates to a vibration actuator having a supporting member including a plurality of position determining members to support a vibration member for stable vibration.

2. Description of the Related Art

Various vibration actuators are known, such as ultrasonic motors, which have characteristics, such as high torque, good controllability, high sustaining power, and noiselessness. For example, one well known type of vibration actuator is "a longitudinal L1-bending B4 mode flat-plate motor," which is described in "222 Piezoelectric Linear Motors for Application to Driving a Light Pick-Up Element, 5th Symposium on Dynamics Related to Electro-magnetic Force, Collected Papers." The known vibration actuator produces an elliptical motion by generating a first order longitudinal vibration, as well as a fourth order bending vibration, thereby generating a driving force through the elliptical motion.

FIG. 14 is a perspective view of an example of a known standing wave type vibration actuator that produces an elliptical motion by generating longitudinal vibration and bending vibration. As shown in FIG. 14, the vibration actuator 120 consists of an elastic member 121; a piezoelectric member 122, which is an electromechanical converting element connected to one of the planes of the elastic member 121; a relative moving member 123 in contact with driving force output members 121b and 121c provided on the other plane of the elastic member 121; and a supporting member 124 to control the position of the elastic member 121.

The elastic member 121 consists of a flat-plate type base 121a, and driving force output members 121b and 121c provided as protrusions on the lower side of the base 121a in order to transmit the driving force. The driving force output members 121b and 121c are provided at the antinode portion (the area where the amplitude is at its maximum) of the bending vibration that occurs during the drive function.

Piezoelectric member 122 is an electromechanical converting element to convert an electrical signal to a mechanical displacement. The piezoelectric member 122 includes driving piezoelectric members 122a and 122b, as well as vibration monitoring piezoelectric members 122p and 122p'. Piezoelectric members 122a, 122b, 122p and 122p' are adhered onto the upper surface of the elastic member 121.

Engaging grooves 121d and 121e are provided on each side of a central area in the width dimension of the base 121a of the elastic member 121, and have a semi-circular configuration when cross-sectioned. The engaging grooves 121d and 121e penetrate through the thickness of the base of 121a and piezoelectric members 122a and 122b.

The supporting member 124 consists of engaging parts 124b and 124c on each side of the bottom surface of the rectangular flat plate supporting member main body 124a disposed at an interval equal to that of engaging grooves 121d and 121e provided on elastic member 121. Engaging part 124b fits in engaging groove 121d, while engaging part 124c fits in engaging groove 121e. In accordance with the structure shown in FIG. 14, the supporting member 124 engages the elastic member 121 from the side where the piezoelectric element 122 of the elastic member 121 is provided. As a result, the supporting member 124 restricts the position of the elastic member 121 in terms of the width direction of elastic member 121, which is a direction that intersects the direction of the relative movement of elastic member 121 (in a direction indicted by the bidirectional arrow in the FIG. 14).

In accordance with the configuration shown in FIG. 14, when a first alternating voltage is applied to the driving piezoelectric member 122a and another alternating voltage having a phase electrically 90 degrees different from that of the first alternating voltage is applied to the driving piezoelectric member 122b, both longitudinal and bending vibrations occur in the elastic member 121. An elliptical movement, synthesized from the longitudinal and bending vibrations, occurs on the driving force output members 121b and 121c, thereby producing a driving force through the elliptical movement to create a relative movement between the elastic member 121 and relative moving member 123.

The vibration monitoring piezoelectric members 122p and 122p' are mechano-electro converting elements. The vibration monitoring piezoelectric members 122p and 122p' generate signals according to the state of the vibrations generated on elastic member 121 and send these signals to a drive circuit (not shown in the figure). Furthermore, the elastic member 121 is connected to a GND potential (not shown in the figure).

However, with the structure shown in FIG. 14, since the engaging parts 124b and 124c are designed to fit in engaging grooves 121d and 121e, respectively, provided on elastic member 121, it is inevitable that gaps are created between the engaging grooves 121d, 121e and the engaging parts 124b, 124c.

If, for example, the gap between the engaging grooves 121d, 121e and the engaging parts 124b, 124c is created along the direction of relative movement between the elastic member 121 and the relative movement member 123, then a backlash may occur at start up, or when reversing, and the vibration actuator 120 or elastic member 121 may shift back and forth when driven. Further, precision in determining a position decreases as a result of the unsteadiness caused by the gap between the engaging grooves 121 and the engaging parts 124 when starting or reversing the vibration actuator, thereby decreasing the capability for responsiveness as well. Still further, the engaging part 124 may collide with the inner wall of the engaging groove 121, or a yawing rotation of elastic member 121 may become unstable with respect to the direction of relative movement. Furthermore, as indicated by an arrow in FIG. 14, a rolling vibration may occur in the elastic member 121. The rolling vibration may result in a vibration and noise from the device in which vibration actuator 120 is integrated.

Moreover, if the gap is created across the direction of relative movement, the elastic member 121 may shift in either the left or right directions while the vibration actuator is driven, thereby resulting in vibration and noise of the device. These vibrations adversely affect the transmission of the driving force between driving force output members 121*b* and 121*c* and relative moving member 123, thereby resulting in a reduction of both the driving speed and the driving force. As a result, the driving efficiency of the vibration actuator decreases.

SUMMARY OF THE INVENTION

It is an object of the present invention to solve the above problems of the conventional vibration actuator.

Objects and advantages of the present invention are achieved in accordance with a first embodiment of the present invention with a vibration member to generate vibration, the vibration member having a specified plane and is in contact with a relative movement member in the specified plane, wherein the vibration of the vibration member generates relative motion between the vibration member and the relative movement member; and a supporting member to support the vibration member, wherein the supporting member includes a plurality of position determining members contacting the vibration member at different locations, and at least one of the plurality of position determining members presses the vibration member.

In accordance with the first embodiment of the present invention, the supporting member comprises at least three position determining members.

In accordance with the first embodiment of the present invention, the vibration member may comprise a first plane having two sides along the direction of the relative motion, and an engaging section on one of the two sides of the first plane; and the supporting member may comprise a first position determining member contacting the vibration member at the engaging section; a second position determining member contacting the vibration member at a location different from that of the first position determining member; and a third position determining member including an elastic member and contacting the vibration member, through an elastic force of the elastic member, at a side opposite the engaging section, and at a location different from that of the second position determining member.

In accordance with the first embodiment of the present invention, at least one of the plurality of position determining members contacts the vibration member at a node of the vibration occurring in the vibration member.

In accordance with the first embodiment of the present invention, the vibration member generates a first order longitudinal vibration and a fourth order bending vibration, and at least one of the plurality of position determining members contacts the vibration member at a node of the fourth order bending vibration.

In accordance with the first embodiment of the present invention, each of the plurality of position determining members contacts the vibration member at a node of the fourth order bending vibration.

In accordance with the first embodiment of the present invention, at least one of the plurality of position determining members contacts the vibration member at an approximate location where a node of the first order longitudinal vibration and a node of the fourth order bending vibration meet.

In accordance with the first embodiment of the present invention, the first position determining member restricts the movement of the vibration member in a direction of the relative motion with respect to the supporting member, and the second and third position determining members do not restrict the movement of the vibration member.

In accordance with the first embodiment of the present invention, the vibration actuator further comprises a press member to press the vibration member and the relative movement member into contact, wherein the first plane is approximately perpendicular to a direction of a pressing force generated by the press member.

In accordance with the first embodiment of the present invention, neither the first, second, nor third position determining members restricts the movement of the vibration member in the direction of the pressing force.

In accordance with embodiments of the present invention, the vibration actuator may further comprise a press member to press the vibration member and the relative moving member into contact, and the supporting member may comprise a first position determining member to restrict a change in the relative position between the vibration member and the supporting member with respect to the direction of relative motion; a position determining press member to press the vibration member from a direction intersecting the pressing direction; and a second position determining member to restrict the movement of the vibration member caused by the position determining press member in a direction intersecting the pressing direction.

In accordance with the first embodiment of the present invention, the supporting member may comprise a first position determining member to restrict a change in the relative position between the vibration member and the supporting member with respect to a direction of the relative movement; a rotational moment generating member to generate a rotational moment around the first position determining member through the pressing force generated by the at least one of the plurality of position determining members; and a second position determining member to restrict the rotation of the vibration member around the position determining member, which is caused by the rotational moment.

Moreover, in accordance with the first embodiment of the present invention, the vibration member may generate a first vibration in a direction approximately parallel to the direction of the relative movement, and a second vibration in a direction approximately perpendicular to the direction of the first vibration.

In accordance with the first embodiment of the present invention, the supporting member may comprise a restricting member to restrict the movement of the vibration member with respect to a direction approximately perpendicular to directions of both the first and second vibrations, and at least one of the position determining members comprises at least a part of the restricting member and presses the vibration member.

In accordance with the first embodiment of the present invention, the restricting member contacts the vibration member so that the vibration member is able to move in the directions of the first and second vibrations.

In accordance with the first embodiment of the present invention, the restricting member may be formed using materials comprising at least one of polyacetal resin, methacrylate plastics, phenol resin, polyamide, fluoroplastics, acrylonitrile-butadiene-styrene resin, polyimide, polyethylene, polyvinylchloride, polycarbonate, polypropylene, polystyrene, and epoxy resin.

Objects and advantages of the present invention are achieved in accordance with a second embodiment of the present invention with a vibration actuator comprising a vibration member to generate vibration, the vibration member having a specified plane and is in contact with a relative movement member in the specified plane, wherein the vibration of the vibration member generates relative motion between the vibration member and the relative movement member; and a supporting member to support the vibration member, wherein the vibration member generates a first vibration in a direction approximately parallel to the direction of relative motion, and a second vibration in a direction approximately perpendicular to the direction of the first vibration, and the supporting member includes a restricting member to restrict the movement of the vibration member with respect to a direction approximately perpendicular to the directions of both the first and second vibrations.

In accordance with the second embodiment of the invention, the restricting member contacts the vibration member on at least three different points, and at least one of the contact points presses the vibration member in a direction approximately perpendicular to a direction of both the first and second vibrations.

In accordance with the second embodiment of the invention, the restricting member may be formed using materials comprising at least one of polyacetal resin, methacrylate plastics, phenol resin, polyamide, fluoroplastics, acrylonitrile-butadiene-styrene resin, polyimide, polyethylene, polyvinylchloride, polycarbonate, polypropylene, polystyrene, and epoxy resin.

In accordance with the second embodiment of the present invention, the supporting member may comprise a first position determining member to restrict a change in the relative position of the vibration member and the supporting member with respect to the direction of the relative motion, and the first position determining member contacts the vibration member at a nodal location of the first vibration, and the restricting member contacts the vibration member at a node of the second vibration.

In accordance with the second embodiment of the present invention, the vibration member includes a notch at the location of the node of the first vibration, and the supporting member includes a first position determining member to engage with the notch to restrict shifting of the relative position of the vibration member and the supporting member with respect to the direction of the relative motion; and the restricting member contacts the vibration member at two different locations, the two different locations being on respective sides of the vibration member along the direction of the relative motion of the vibration member.

In accordance with the second embodiment of the present invention, the first position determining member and the restricting member may allow either of the contact points thereof with the vibration member to contact the vibration member in a manner that the vibration member is able to move in a direction of the second vibration.

BRIEF DESCRIPTION OF THE DRAWINGS

These and other objects and advantages of the invention will become apparent and more readily appreciated from the following description of the preferred embodiments, taken in conjunction with the accompanying drawings of which:

FIG. 9A is a front view of an ultrasonic actuator in accordance with a sixth embodiment of the present invention.

FIG. 9B is an explanatory drawing showing a waveform of the vibration occurring in the vibration member of the ultrasonic actuator in accordance with the sixth embodiment of the present invention.

FIG. 9C is a plane view of the vibration member in accordance with the sixth embodiment of the present invention.

FIG. 10A is a front view of the ultrasonic actuator having a section thereof removed in accordance with the sixth embodiment of the present invention.

FIG. 10B is an explanatory diagram of a waveform of the vibration occurring in the vibration member in accordance with the sixth embodiment of the present invention.

DETAILED DESCRIPTION OF THE PREFERRED EMBODIMENTS

Figure 1A:
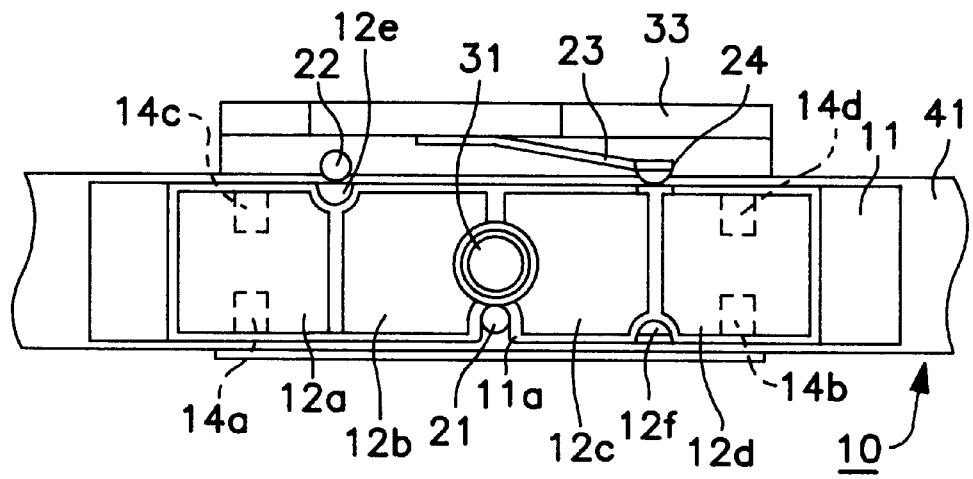
FIG. 1A is a top view of an ultrasonic actuator with a section thereof removed in accordance with a first embodiment of the present invention.

Reference will now be made in detail to the preferred embodiments of the present invention, examples of which are illustrated in the accompanying drawings, wherein like reference numerals refer to like elements throughout.

First Preferred Embodiment

In the following explanation of the preferred embodiments of the present invention, a linear-type ultrasonic actuator which utilizes the ultrasonic vibration range is used as an example to of a vibration actuator.

Figure 1B:
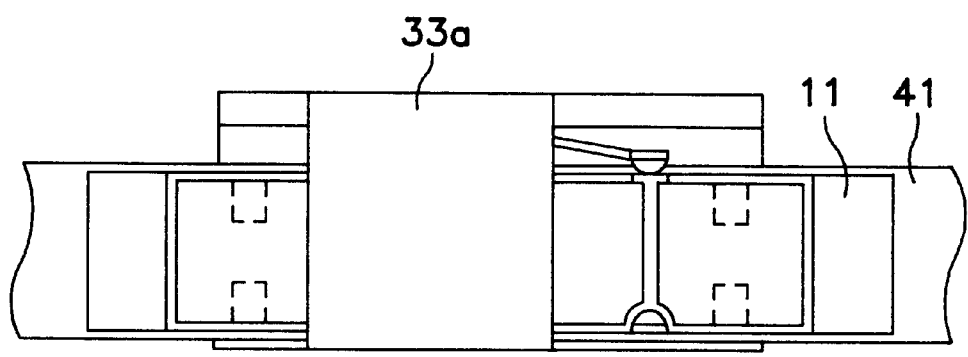
FIG. 1B is a top view of the ultrasonic actuator in accordance with the first embodiment of the present invention.
Figure 1C:
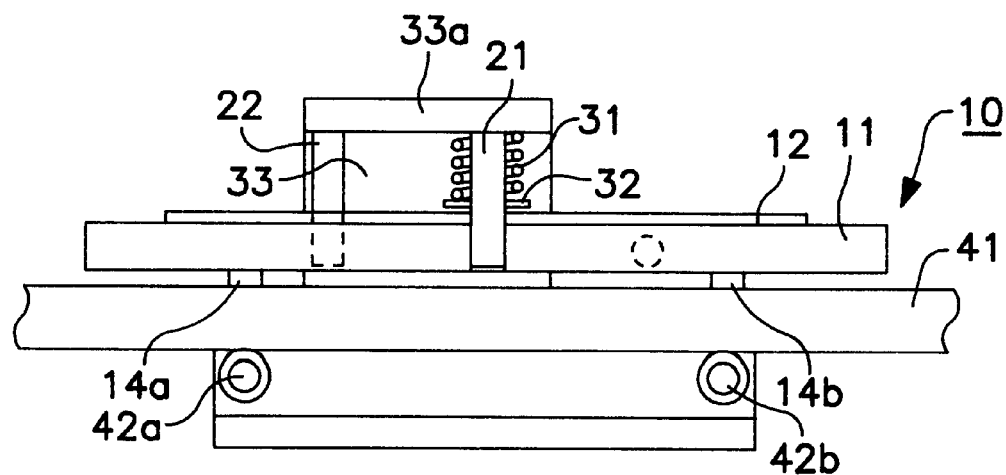
FIG. 1C is a side view of the ultrasonic actuator in accordance with the first embodiment of the present invention.
Figure 2A:
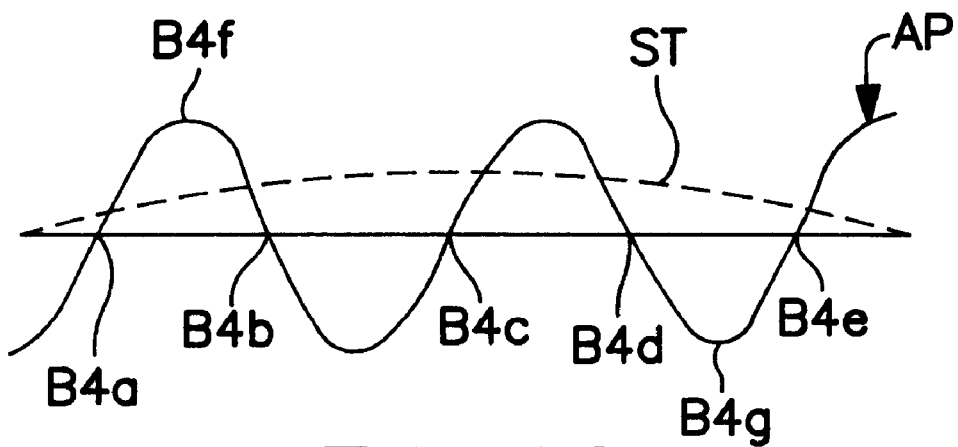
FIG. 2A is an explanatory diagram depicting a vibration mode occurring in a vibration member in shown FIG. 1 in accordance with the first embodiment of the present invention.
Figure 2B:
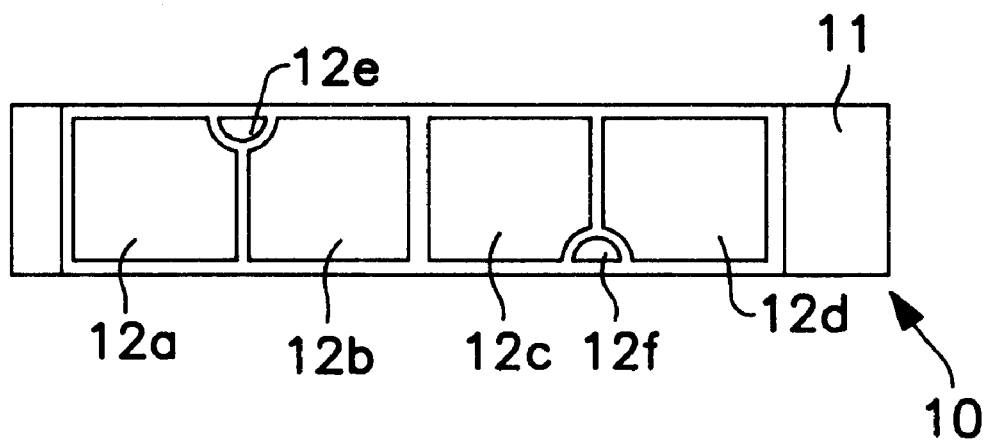
FIG. 2B is a plane view of the vibration member shown in FIG. 1 in accordance with the first embodiment of the present invention.

FIGS. 1A–1C are schematic diagrams showing the structure of an ultrasonic actuator in accordance with a first embodiment of the present invention. More particularly, FIG. 1A is a top view of the ultrasonic actuator with a section thereof removed (cover 33a of supporting member 33, which will be addressed hereinbelow); FIG. 1B is a top view of the vibration actuator; and FIG. 1C is a side view of the ultrasonic actuator. FIGS. 2A and 2B are explanatory diagrams depicting a relationship between a vibration member and a vibration mode occurring in the vibration member in the ultrasonic actuator in accordance with the first embodiment of the invention. More particularly, FIG. 2A is an explanatory drawing depicting a vibration mode occurring in a vibration member 10 shown in FIG. 1; and FIG. 2B is a plane view of the vibration member 10 shown in FIG. 1.

As shown in FIG. 1, the ultrasonic actuator includes a vibration member 10 that is pressed to make contact with a relative moving member 41, and a supporting member 33 to support the vibration member 10.

First, the configuration of the vibration member 10 will be described below followed by an explanation of the supporting member 33. The vibration member 10 comprises a quadrilateral rectangular elastic member 11, a thin plate-like piezoelectric member 12 joined to a plane of the elastic member 11, and driving force output members 14a, 14b, 14c, and 14d provided on a plane on elastic member 11 opposite from the plane where piezoelectric member 12 is joined.

The elastic member 11 is made of an elastic material, such as metal or plastic. A notch 11a is created on a longer side of the elastic member 11 at a roughly central location. The location where notch 11a is created is also the location of a node of longitudinal and bending vibrations, which will be addressed later.

The piezoelectric member 12 functions as an electromechanical converting element to convert electrical energy into mechanical displacement. The piezoelectric member 12 comprises, for example, piezoelectric ceramics such as barium titanate or lead zirconate titanate. Electrodes 12a, 12b, 12c, 12d, 12e, and 12f are provided on the upper surface of the piezoelectric member 12. The electrodes 12a–12d are driving electrodes to which an alternating voltage is applied as a drive signal. Moreover, the electrodes 12e and 12f are detection electrodes to detect the conditions of the vibration of the elastic member 11, and to generate an electrical signal according to the conditions of the vibration of the elastic member 11. The piezoelectric member 12 generates a first order longitudinal vibration and a fourth order bending vibration in the elastic member 11 as the alternating voltage is applied thereto. The piezoelectric member 12 may be disposed on the same plane as the driving force output members 14a–14d, as long as the piezoelectric member 12 does not interfere with the driving force output members 14a–14d.

The driving force output members 14a–14d are formed of a sliding material, such as plastic, or the like, in order to improve the sliding conditions with respect to the relative movement member 41. The driving force output members 14a–14d are adhered in the vicinity of the antinode of the bending vibration occurring in the elastic member 11. The driving force output members 14a–14d may be integrated with the elastic member 11 to form protrusions.

FIG. 2A is an explanatory diagram showing an amplitude AP of the fourth order bending vibration occurring in the vibration member 10 (elastic member 11) at various points of the vibration member 10, and a distortion ST at various points of the first order longitudinal vibration. As shown in FIG. 2A, B4a, B4b, B4c, B4d, and B4e indicate the nodes of the vibration at which the amplitude of the bending vibration is zero, and B4f and B4g indicate the antinodes of the vibration at which the amplitude of bending vibration reaches a maximum point.

As shown in FIG. 1A and FIG. 2B, detection electrodes 12e and 12f are formed in a semicircular shape near the longer sides of the elastic member 11 corresponding to the locations of the nodes B4b and B4d of the bending vibration occurring in the elastic member 11. The detection electrodes 12e and 12f are formed symmetrically with the nodes B4b and B4d, respectively, in the center. Because detection electrodes 12e and 12f generate almost identical signals, it is also acceptable to use either one of the detection electrodes 12e, 12f alone.

The configuration of the supporting member 33 will now be described below. The supporting member 33 includes a first position determining member 21, a second position determining member 22, a third position determining member 24, a position determining press member 23, a pressing member 31, a press member 32, and rollers 42a and 42b. The supporting member 33 supports the vibration member 10 to a base (not shown).

The first position determining member 21 is formed like a pin, and one end thereof is secured to a cover 33a of the supporting member 33. The first position determining member 21 is fit into the notch 11a while maintaining a gap. The second position determining member 22 is also formed like a pin in a manner similar to the first position determining member 21, and one end thereof is secured to the cover 33a of the supporting member 33. As shown in FIG. 1A, the second position determining member 22 contacts the side of the elastic member 11, opposite from the plane where the notch 11a is located. The position determining press member 23 has one end thereof secured to the supporting member 33. The third position determining member 24 is formed in a semi-circular shape and is secured to the other end of position determining press member 23. The third position determining member 24 contacts the elastic member 11 on a side opposite from the plane where the notch 11a of elastic member 11 is located, and at a point different from the contact point of the second position determining member 22 and elastic member 11. Furthermore, the third position determining member 24 is pressed against the elastic member 11 through the elastic force of the position determining press member 23.

The press member 31 comprises a coil spring having one end thereof secured to the cover 33a of the supporting member 33 and having the press member 32 at the other end. The press member 32 presses the vibration member 10 with a specified force toward the relative movement member 41. As a result of the force of the press member 32, the vibration member 10 is pressed into contact with the relative movement member 41 through driving force output members 14a–14d. Although the press member 31 is preferably a coil spring, a plate spring may also be used as the press member 31.

Both rollers 42a and 42b are retained on the supporting member 33 while being allowed to rotate. By placing the relative movement member 41 between the rollers 42a and 42b and the vibration member 10, the relative movement member 41 is retained while being allowed to move laterally in FIG. 1. As shown in FIG. 1C, the roller 42a is approximately juxtaposed with the driving force output members 14a and 14c across relative movement member 41, and the roller 42b is approximately juxtaposed with the driving force output members 14b and 14d across the relative movement member 41.

In accordance with the first embodiment of the invention, the supporting member 33 determines the position of the vibration member 10 with respect to the direction of the relative movement (the transversal direction of the elastic member 11) between the vibration member 10 and the relative movement member 41 as the first position determining member 21 is inserted in notch 11a. The position of the vibration member 10 is also determined in the transversal direction (a direction intersecting the direction of the relative movement) and the rotational direction of the elastic body 11 as the second position determining member 22 and the third position determining member 24 make contact with the elastic body 11 on the opposite side from the plane where the notch 11a is created and the third position determining member 24 is pressed against elastic member 11 with a specified force by the position determining press member 23.

The first position determining member 21 and the notch 11a are engaged with a slight gap therebetween. Either the second position determining member 22 or the third position determining member 24 minimally restrict the movement of vibration member 10 in the pressing direction by the press member 31. As a result, when the force is applied to elastic member 11 by the press member 31 to press against relative movement member 41, the elastic member 11 is able to move in the pressing direction. Subsequently, the pressing force of the press member 31 is transmitted to make contact between the vibration member 10 and the relative movement member 41 at a specified force. Because the elastic member 11 is pressed by the third position determining member 24, unsteadiness caused by the gap between the first position determining member 21 and the notch 11a is virtually eliminated. Consequently, the movement of the elastic member 11 in the direction of relative movement during the drive process can be controlled. Moreover, the rotational movement of the elastic member 11 toward the direction of relative movement, or the lateral shifting thereof, can also be controlled.

As a result, in accordance with embodiments of the present invention, it is possible to prevent decreased accuracy in the process of determining the position of the vibration actuator and to prevent decreased responsiveness. Furthermore, it is possible to control the generation of vibration or noise from the vibration actuator, or from the device in which the vibration actuator is integrated.

In accordance with the first embodiment of the present invention, a first order longitudinal vibration and a fourth order bending vibration are generated in the elastic member 11 of the ultrasonic actuator when the elastic member 11 is connected to the GND potential, a first alternating voltage is applied to the electrodes 12a and 12c by a drive circuit (not shown), and a second alternating voltage having both a voltage and frequency which are almost equal to those values of the first alternating voltage, and a phase set to differ approximately $(+\pi/2)$ or $(-\pi/2)$ from that of the first alternating voltage, is applied to electrodes 12b and 12d. The longitudinal vibration is generated in a direction almost parallel to the direction of relative movement, while the bending vibration is generated in a direction intersecting the direction of the longitudinal vibration. The longitudinal and bending vibrations are combined to generate an elliptical movement, and the relative movement member 41 is driven in either the left or right directions in FIG. 1C through the elliptical movement. To change the direction of the drive of the relative movement member 41, the sign of the phase difference between the first alternating voltage and the second alternating voltage is reversed.

In accordance with the first embodiment of the invention, the vibration member 10 is supported with virtually no unsteadiness, and it is possible to prevent decreased accuracy in determining the position, or decreased responsiveness caused by the unsteadiness. Furthermore, it is possible to control the generation of vibration or noise in the vibration actuator and in the device in which the vibration actuator is integrated, thereby improving drive efficiency.

FIGS. 3A–3D illustrate plane views of the vibration member 10 showing locations of position determining members with respect to the amplitude of the vibration that occurs on vibration member 10 (elastic member 11) in accordance with a modification of the first embodiment of the invention. In FIGS. 3–6 which are used in the following description, the position determining press member 23 is shown as coil spring 25, and is depicted as a third position determining member 26.

The first position determining member 21 contacts the vibration member 10 at location B4c, which is the approximate center of the elastic member 11 transversely (in the direction of relative movement) and is the location of a node of the bending vibration. The location B4c is also a node of the longitudinal vibration. The second position determining member 22 contacts the vibration member 10 at location B4b, which is a node of the bending vibration. The third position determining member 26 contacts the vibration member 10 at the location B4d, which is another node of the bending vibration. The decrease in the bending vibration caused by the contact being made by the position determining members 21, 22, 26 may be controlled by having all three position determining members 21, 22, 26 make contact with the vibration member 10 at nodes of the bending vibration. Furthermore, the position determining member 21 that sets the position of vibration member 10 in the transversal direction contacts the vibration member 10 at location B4c, which is the location of a node of longitudinal vibration, thereby enabling the capability to control the decrease in longitudinal vibration.

Figure 3A:
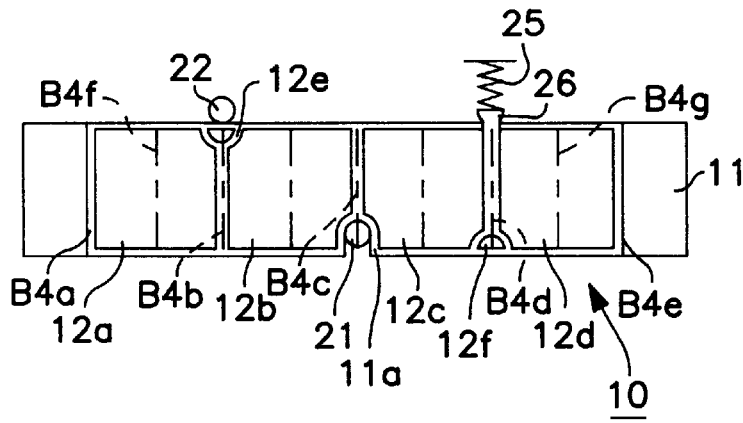
FIGS. 3A–3D are plane views showing the locations of the position determining members of FIG. 1 in reference to the amplitude of the vibration that occurs in the vibration member (elastic member) in accordance with a modification of the first embodiment of the present invention.
Figure 3B:
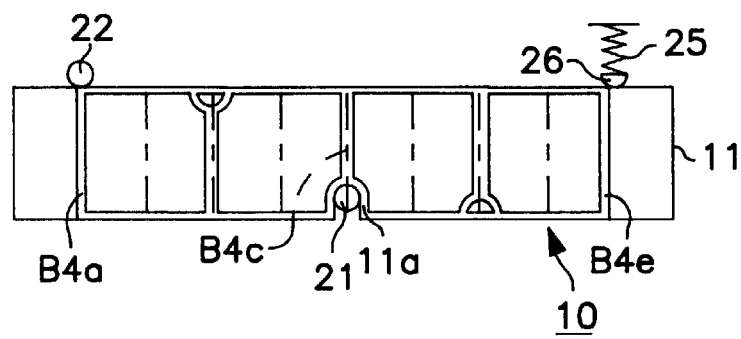

FIG. 3B illustrates a configuration of position determining members where the second position determining member 22 contacts the vibration member 10 at a location B4a which is a node of the bending vibration on one end of vibration member 10, while the third position determining member 26 contacts the vibration member 22 at the location B4e, which is another node of bending vibration on the other end of vibration member 10. The arrangement shown in FIG. 3B is also as effective as the arrangement shown in FIG. 3A in its capability of not decreasing either the bending vibration or the longitudinal vibration generated in vibration member 10. As the space between respective position determining members 21, 22, 26 is increased in comparison with the arrangement in shown in FIG. 1A, the effectiveness in eliminating unsteadiness is further improved.

Figure 3C:
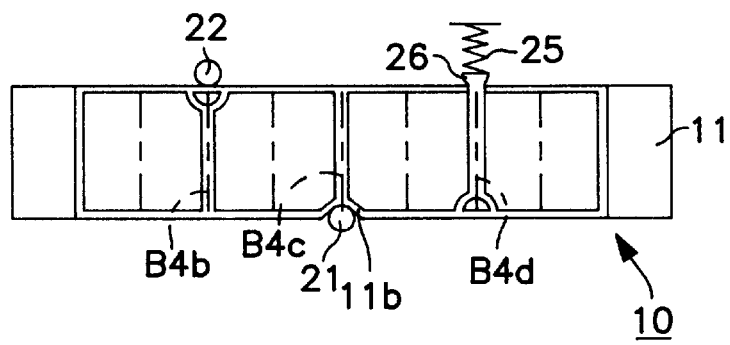

FIG. 3C illustrates a configuration in which the notch 11*a* on the elastic member 11 is replaced by V-shape notch 11*b*. As shown in FIG. 3C, because the first position determining member 21 contacts the vibration member 10 at two points, the effectiveness in eliminating unsteadiness in the transversal direction is further improved in comparison with the configuration shown in FIG. 1A.

Figure 3D:
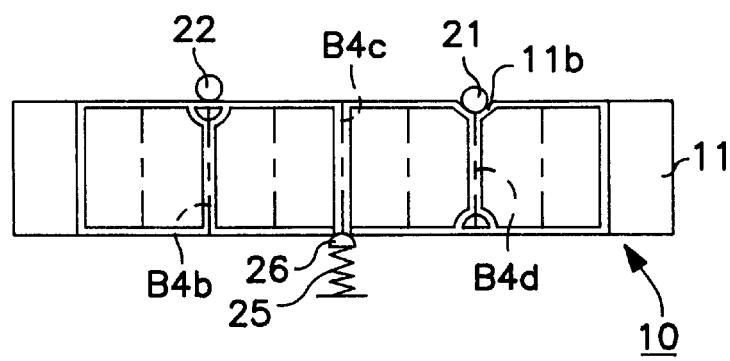

FIG. 3D illustrates a configuration in which the locations of the first position determining member 21 and the third position determining member 26 are interchanged. In accordance with configuration shown in FIG. 3D, an elastic force from the position determining press member 23 operates toward the location B4*c*, which is a node of both the bending and longitudinal vibrations. Moreover, as the location of position determining member 21, which sets the position of vibration member 10 in the transversal direction, becomes closer to the location B4*g*, which is an antinode of the bending vibration at which driving force output member 14 is provided, the effectiveness in setting the position for the driving force output member is 14 improved.

Second Preferred Embodiment

Figure 4A:
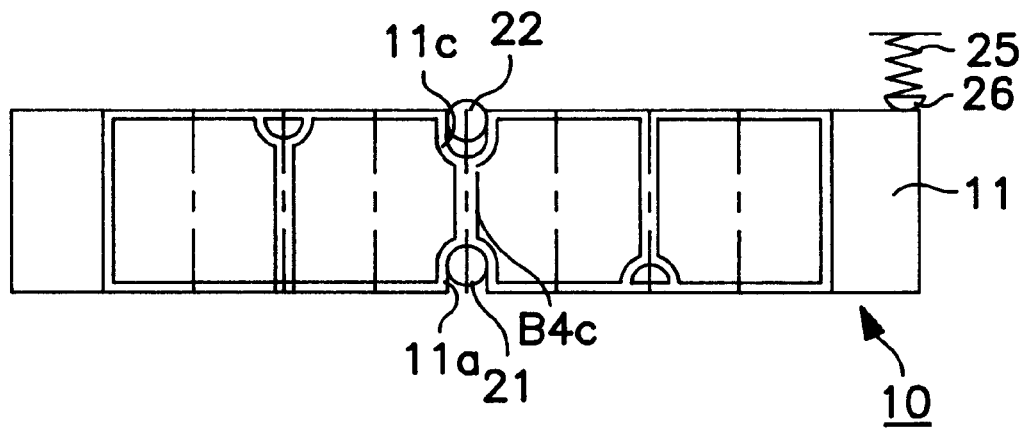
FIGS. 4A–4B are plane views of a vibration member (elastic member) of a vibration actuator in accordance with a second embodiment of the present invention.
Figure 4B:
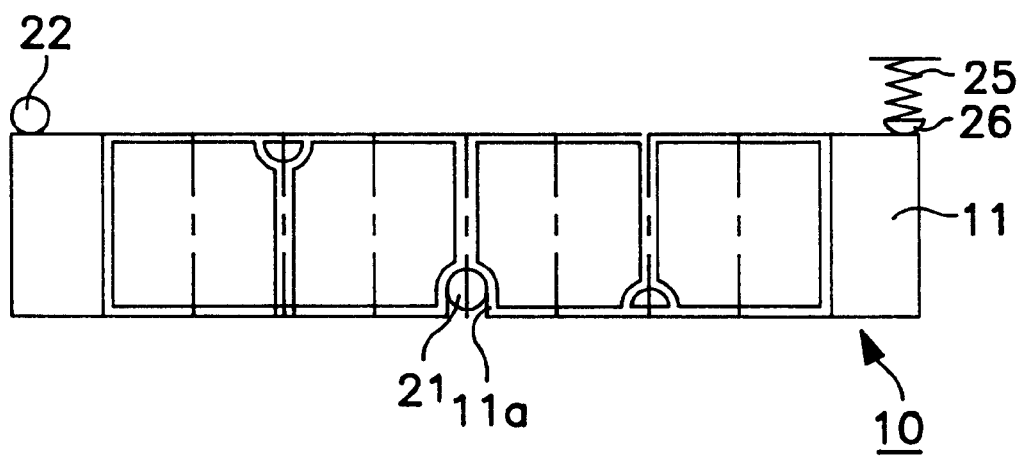

FIGS. 4A and 4B are plane views of a vibration member 10 of a vibration actuator in accordance with a second embodiment of the present invention. More particularly, FIGS. 4A and 4B illustrate the locations of position determining members with respect to an amplitude of the vibration occurring in the vibration member 10 (elastic member 11). In accordance with the second embodiment of the present invention, the contact point of the third position determining member 26 and the vibration member 10 is located near the end of the vibration member 10.

As shown in FIG. 4A, notches 11*a* and 11*c* are provided on each side of the approximate center of the elastic member 11 in the transversal direction. A pin-shaped first position determining member 21 is inserted in the notch 11*a*, while leaving a slight gap between the pin-shaped first determining member 21 and the notch 11*a*. The second position determining member 22 is inserted in the notch 11*c*, while leaving a slight gap between the second position determining member 22 and the notch 11*c*. The distance between first and second position determining members 21, 22 is wider than the distance between the notches 11*a* and 11*c* in order to allow for movement in a direction of pressing by the press member 31, as shown in FIG. 1. Moreover, the third position determining member 26 is pressed against the vibration member 10 by the coil spring 25. The position determining member 21 makes contact with the vibration member 10 at the bottom part of the notch 11*a* (upper part in FIGS. 4A and 4B). The position determining member 22 also makes contact with the vibration member 10 at a section of the side surface of the notch 11*c*, which is opposite from the location of the third position determining member 26. Consequently, the position of the vibration member 10 is set within a plane parallel to the surface contacting the relative movement member 41. In accordance with the second preferred embodiment, the effectiveness in eliminating the unsteadiness is further increased in comparison with the first embodiment because it is possible to widen the distance between the third position determining member 26, and the first and second position determining members 21 and 22.

As shown in FIG. 4B, the second position determining member 22 may contact the vibration member 10 near the end opposite from the third position determining member 26. Accordingly, the effectiveness in eliminating the unsteadiness is further increased because the distance between the position determining member 21 and the other position determining members is widened in comparison with the configuration shown in FIG. 4A.

Third Preferred Embodiment

Figure 5A:
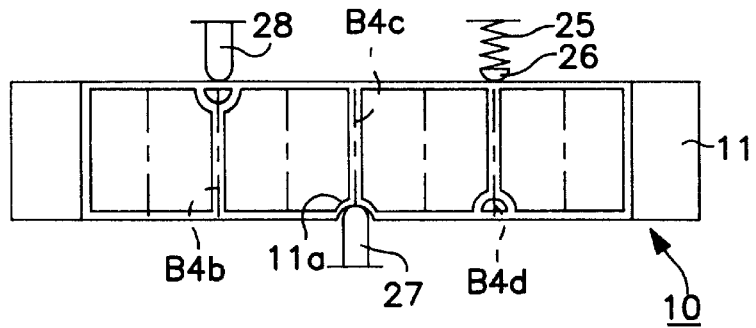
FIG. 5A is a plane view showing the location of position determining members with respect to the amplitude of the vibration occurring in the vibration member (elastic member) in accordance with a third embodiment of the present invention.
Figure 5B:
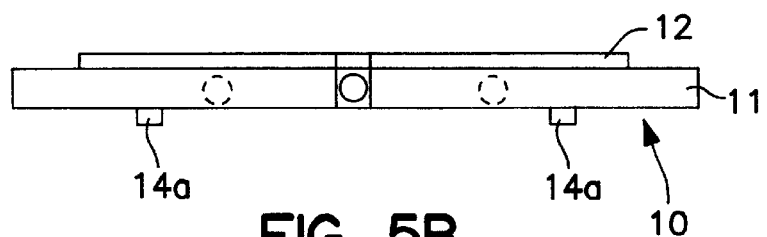
FIG. 5B is a side view of the vibration member shown in FIG. 5A in accordance with the third embodiment of the present invention.

FIGS. 5A and 5B are schematic diagrams illustrating a configuration of position determining members for the vibration member 10 in accordance with a third preferred embodiment of the present invention. More particularly, FIG. 5A is a plane view showing the location of position determining members with respect to the amplitude of the vibration occurring in the vibration member 10 (elastic member 11); and FIG. 5B is a side view of the vibration member 10 shown in FIG. 5A. In accordance with the third embodiment of the present invention, cylindrical members, each having an end formed in a semi-spherical shape for making contact, are used as a first position determining member 27 and a second position determining member 28. Other elements shown in FIGS. 5A and 5B are the same as or similar to those shown in FIG. 3A.

As described hereinabove, the third position determining member 26 also has a semi-spherical shape. Therefore, in accordance with the third embodiment of the present invention, each position determining member 26, 27, 28 can contact the elastic member 11 at the approximate center of the thickness of the elastic member 11. Therefore, because each position determining member 26, 27, 28 makes contact with the vibration member 10 at a contact point, the contact position has improved stability over the first or second embodiments wherein contact with the vibration member 10 is made using pin-shaped position determining members. Furthermore, a decrease in the bending and longitudinal vibration are also reduced.

Figure 6A:
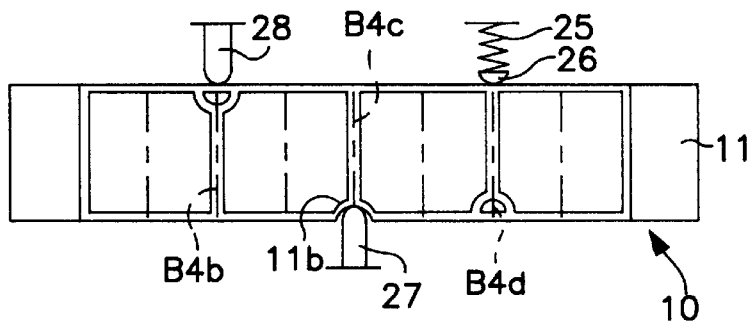
FIG. 6A is a plane view showing the location of the position determining members with reference to the amplitude of the vibration that occurs in the vibration member (elastic member) in accordance with a modification of the third embodiment of the present invention.
Figure 6B:
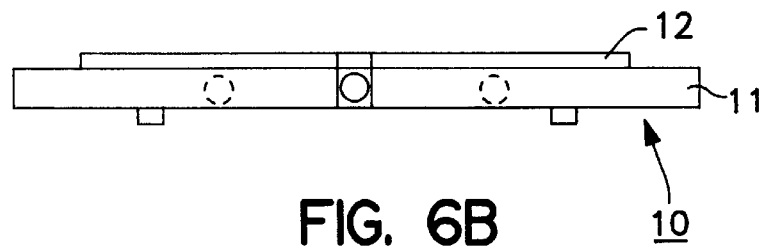
FIG. 6B is a side view of the vibration member shown in FIG. 6A in accordance with the modification of the third embodiment of the present invention.

FIG. 6 is a schematic diagram illustrating a configuration of the position determining members for the vibration member 10 in accordance with a modification of the third embodiment of the present invention. More particularly, FIG. 6A is a plane view showing the locations of position determining members with reference to the amplitude of the vibration occurring in the vibration member 10 (elastic member 11). FIG. 6B is a side view of the vibration member 10 shown in FIG. 6A. In accordance with the modification of the third embodiment shown in FIG. 6, cylindrical members, each having an end formed in semi-spherical shape for making contact, are used as the first position determining member 27 and the second position determining member 28. Other elements shown in FIGS. 6A and 6B are the same as or similar to those shown in FIG. 3C.

As shown in FIGS. 6A and 6B, the first position determining member 27 contacts the elastic member 11 at two points. Therefore, the vibration member 10 contacts the position determining members, including second and third position determining members 26 and 28, respectively, at a total of four points. As a result, the effectiveness in eliminating the unsteadiness of vibration member 10 in the transversal direction is increased, thereby further improving the accuracy in setting the position.

Fourth Preferred Embodiment

Figure 7A:
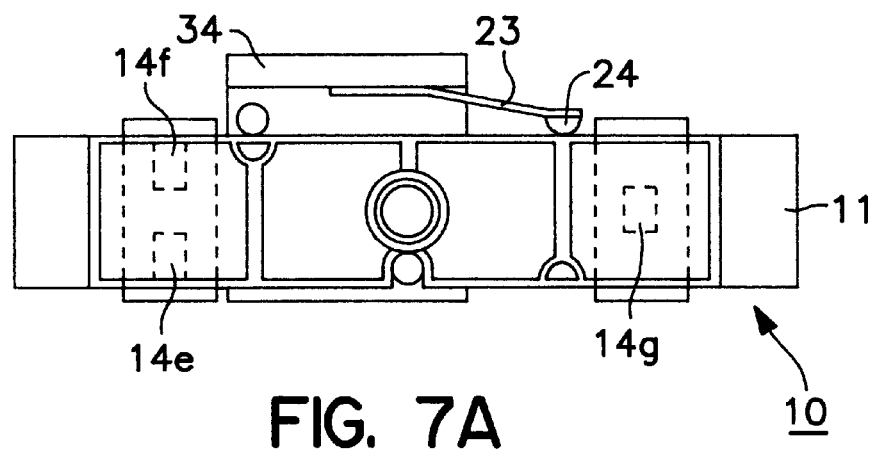
FIG. 7A is a top view of an ultrasonic actuator with a section of the ultrasonic actuator removed in accordance with a fourth embodiment of the present invention.
Figure 7B:
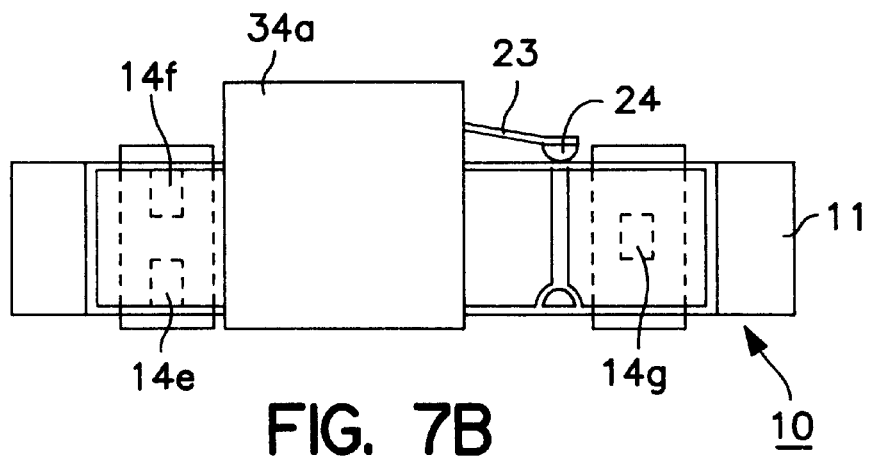
FIG. 7B is a top view of the ultrasonic actuator in accordance with the fourth embodiment of the present invention.
Figure 7C:
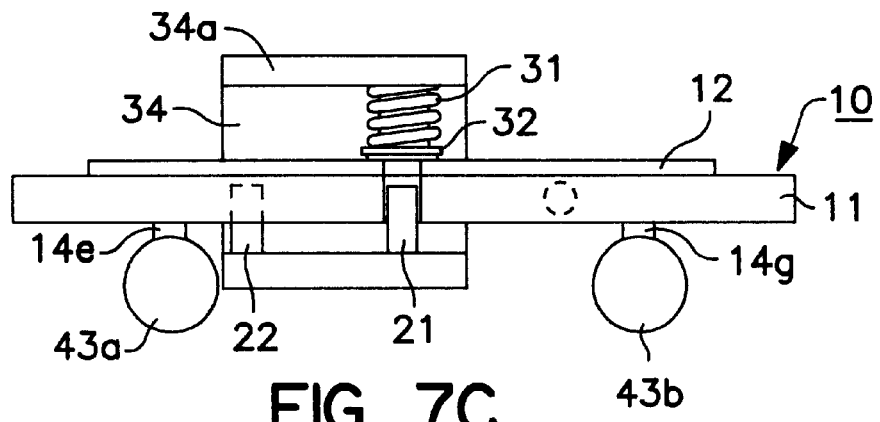
FIG. 7C is a side view of the ultrasonic actuator in accordance with the fourth embodiment of the present invention.

FIG. 7 is a schematic diagram illustrating an ultrasonic actuator in accordance with a fourth embodiment of the present invention. More particularly, FIG. 7A is a top view showing the ultrasonic actuator with a section thereof removed (cover 34*a* of supporting member 33, which will be described hereinbelow); FIG. 7B is a top view of the ultrasonic actuator; and FIG. 7C is a side view of the ultrasonic actuator. As shown in FIGS. 5A–7C, elements having the same or similar function to those shown in FIG. 1 are referred to by the same reference numerals, and a detailed explanation of these like elements will not be repeated here.

In accordance with the fourth embodiment of the present invention, rollers 43a and 43b are used as relative movement members to generate rotational movement. In a manner similar to the embodiment shown in FIG. 3A, the position of the vibration member 10 is also set by first, second, and third position determining members 21, 22 and 24, respectively.

Furthermore, in accordance with the fourth embodiment of the invention, the vibration member 10 includes three driving force output members. As shown in FIG. 7A, a driving force output member 14e is provided at a location corresponding to the driving force output member 14a shown in FIG. 1A. A driving force output member 14f is provided at a location corresponding to the driving force output member 14b shown in FIG. 1A. A driving force output member 14g is provided at a location corresponding to the approximate midway between driving force output members 14b and 14d as shown in FIG. 1A. As shown in FIGS. 7A–7C, even if the shafts between rollers 43a, 43b are not parallel due to an installation error of the two rollers 43a and 43b, the three driving force output members 14e, 14f, 14g constantly contact the rollers 43a, 43b, avoiding a situation where the contact is made only by one of the driving force output members 14e, 14f, 14g. Moreover, none of position determining members 21, 22, 24 restricts the movement on a plane other than the contacting surface between the vibration member 10 and rollers 43a and 43b, thereby assuring the contact between the vibration member 10 and rollers 43a and 43b at three locations. Thus, in accordance with the fourth embodiment of the invention, the driving efficiency of the vibration actuator is improved.

Fifth Preferred Embodiment

Figure 8:
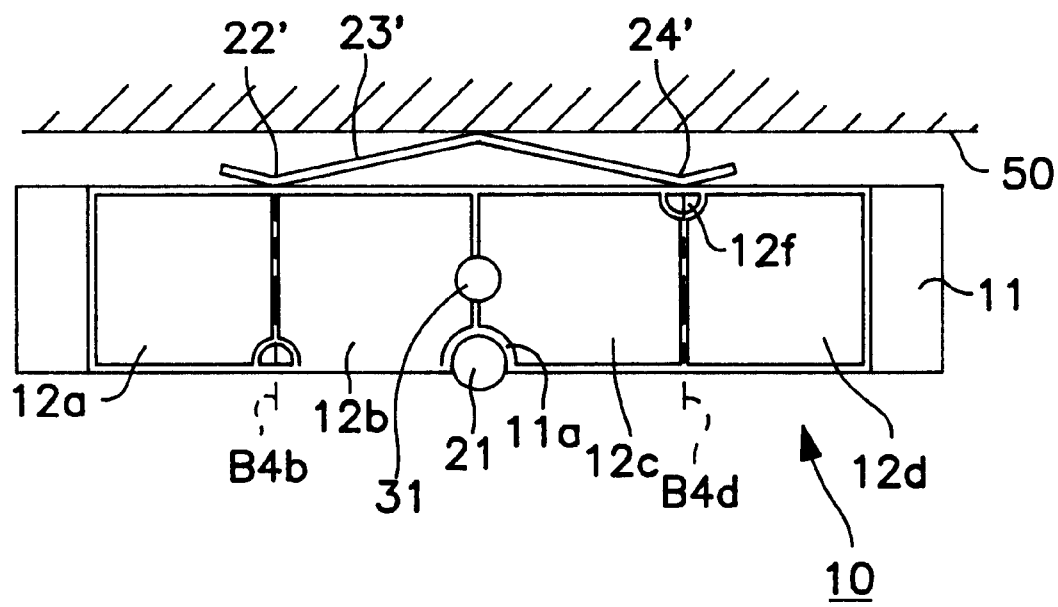
FIG. 8 is a plane view of an ultrasonic actuator in accordance with a fifth embodiment of the present invention.

FIG. 8 is a plane view of an ultrasonic actuator in accordance with a fifth preferred embodiment of the present invention. Elements shown in FIG. 8 which are the same as or similar to those shown in FIG. 1A are referred to by the same reference numerals, and a detailed description of these like elements will not be repeated here. Further, the relative movement members are omitted from FIG. 8.

In accordance with the fifth embodiment of the present invention, a plate spring, identified as position determining press member 23', is partitioned between the elastic member 11 and a base 50. The plate spring 23' is secured to the base 50. The plate spring 23' contacts the side of the elastic member 11 at two locations, B4b and B4d, which are nodes of the bending vibration occurring in the elastic member 11. The plate spring 23' contacts the elastic member 11 at contacting areas 22' and 24' on the plate spring 23', which function as second and third position determining members, respectively.

In accordance with the fifth embodiment of the present invention, the first position determining member 21 fits into the notch 11a of the elastic member 11, and the position of vibration member 10 is set with respect to the direction of relative movement between the vibration member 10 and the relative movement member (not shown). Because the elastic member 11 is pressed against the first position determining member 21 by the position determining press member 23', unsteadiness caused by the space between the first position determining member 21 and the notch 11a hardly exists. Consequently, effects similar to those achieved with the first through fourth embodiments are attained with a simpler configuration.

Sixth Preferred Embodiment

Figure 11:
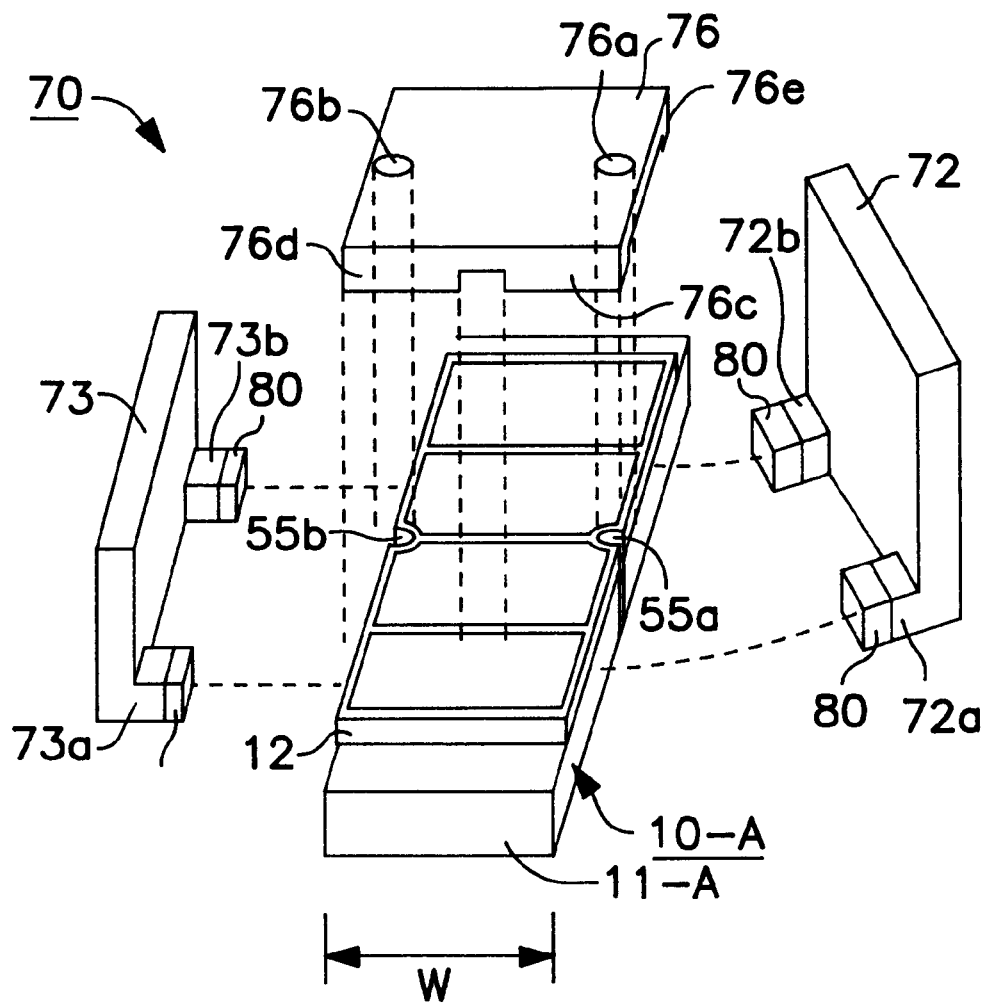
FIG. 11 is a perspective view of main sections of the vibration member and supporting member of the ultrasonic actuator in accordance with the sixth embodiment of the present invention.
Figure 12:
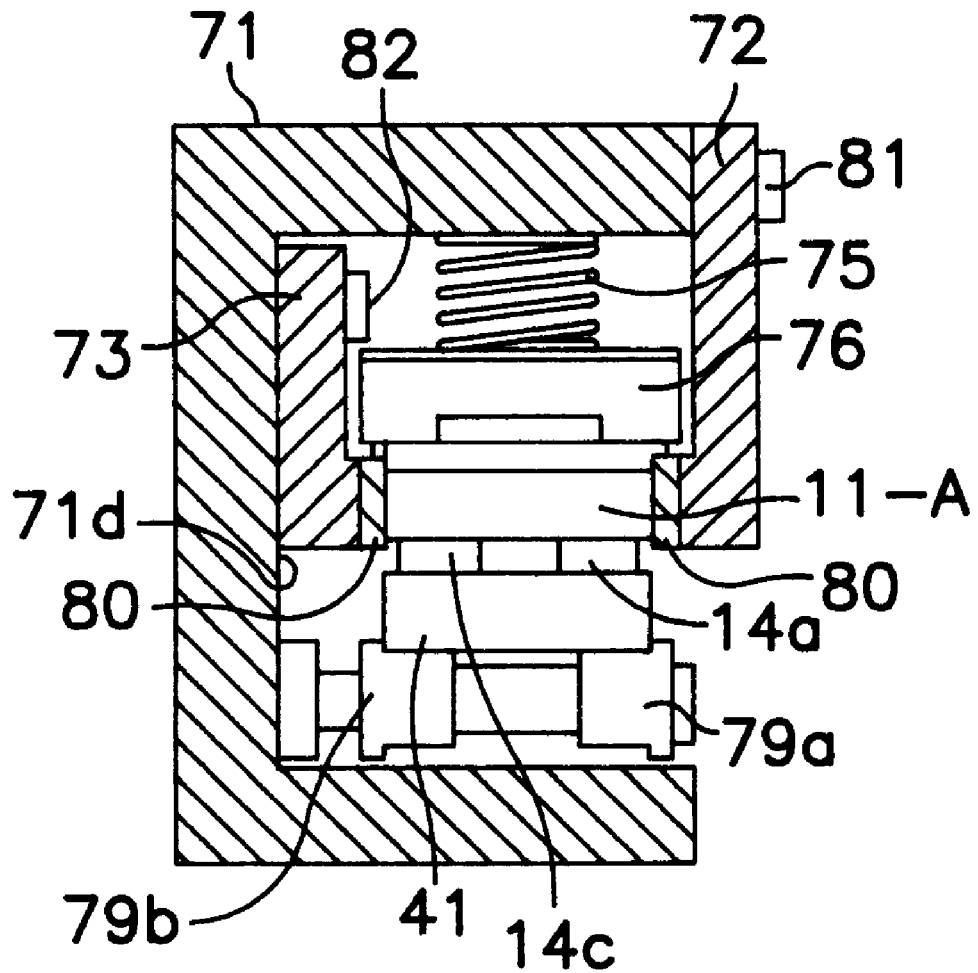
FIG. 12 is a cross-sectional view of FIG. 9A taken along the 12—12 cross-section in accordance with the sixth embodiment of the present invention.

FIGS. 9 through 12 are schematic diagrams of an ultrasonic actuator in accordance with a sixth preferred embodiment of the present invention. FIGS. 9A and 9B are schematic diagrams of the ultrasonic actuator in accordance with the sixth embodiment of the invention. More particularly, FIG. 9A is a front view of the ultrasonic actuator; FIG. 9B is an explanatory drawing showing a waveform of the vibration occurring in the vibration member of the ultrasonic actuator; and FIG. 9C is a plane view of the vibration member. FIG. 10A is a front view of the ultrasonic actuator with a section thereof removed; and FIG. 10B is an explanatory diagram of a waveform of the vibration occurring in the vibration member. FIG. 11 is a perspective view of a main portion of the vibration member and supporting member in accordance with the sixth embodiment of the present invention. FIG. 12 is a cross-sectional view of FIG. 9A taken along the 12—12 cross-section. The elements shown in FIGS. 9–12 which are the same as or similar to the elements shown in FIG. 1 are referred to by like reference elements and a detailed description of these like elements will not be repeated here.

The ultrasonic actuator in accordance with the sixth embodiment of the invention comprises a vibration member 10-A that is pressed against the relative movement member 41 to make a contact, a supporting member 70 to support the vibration member 10-A; and a casing 71 to accommodate the vibration member 10-A, and to allow the relative movement member 41 to pass through.

The vibration member 10-A comprises an elastic member 11-A having a quadrilateral rectangular shape, a one piece piezoelectric member 12 adhered to a plane of the elastic member 11-A, and driving force output members 14a, 14b, 14c and 14d provided on a plane of the elastic member 11-A opposite from the plane to which the piezoelectric member 12 is adhered. The vibration member 10-A has a configuration which is almost identical to that of the vibration member 10 shown in FIG. 1. The vibration member 10-A differs in that semi-circular notches 55a and 55b are provided on opposite sides of the center area of the elastic member 11-A, 15 respectively, in the transversal direction. More specifically, the semi-circular notches 55a, 55b are provided at a location B4c, which is a node of the first order longitudinal vibration occurring in vibration member 10-A.

Figure 13:
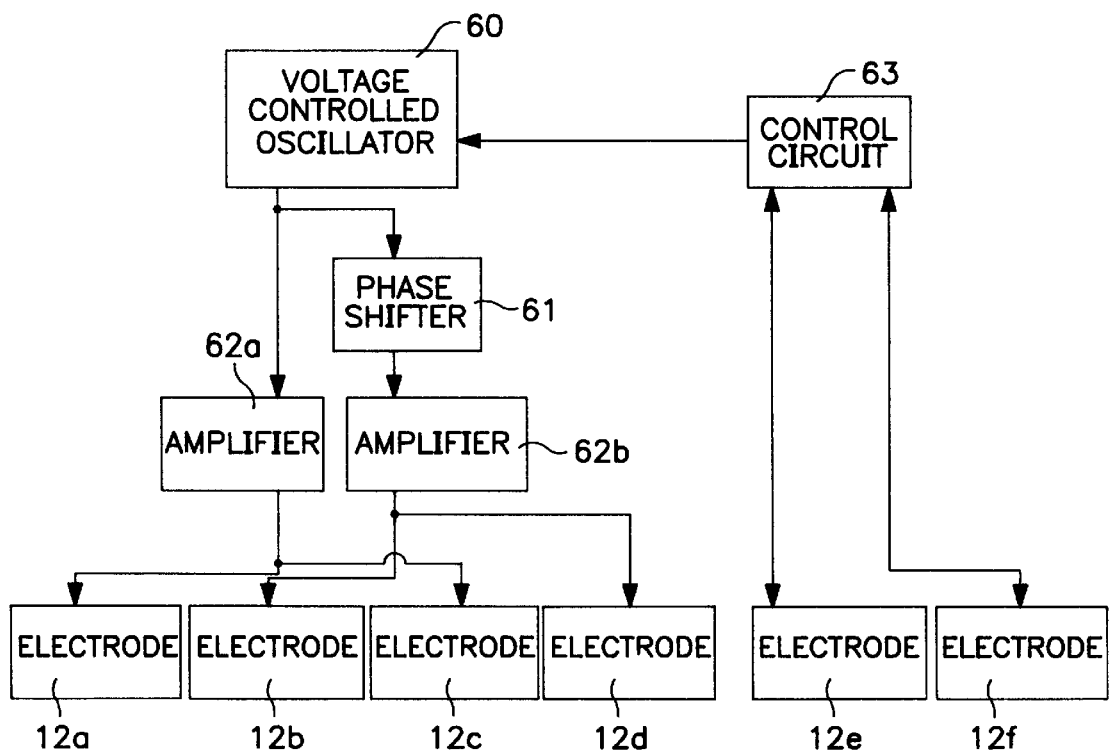
FIG. 13 is a block diagram of a drive circuit of the ultrasonic actuator in accordance with the sixth embodiment of the present invention.
Figure 14:
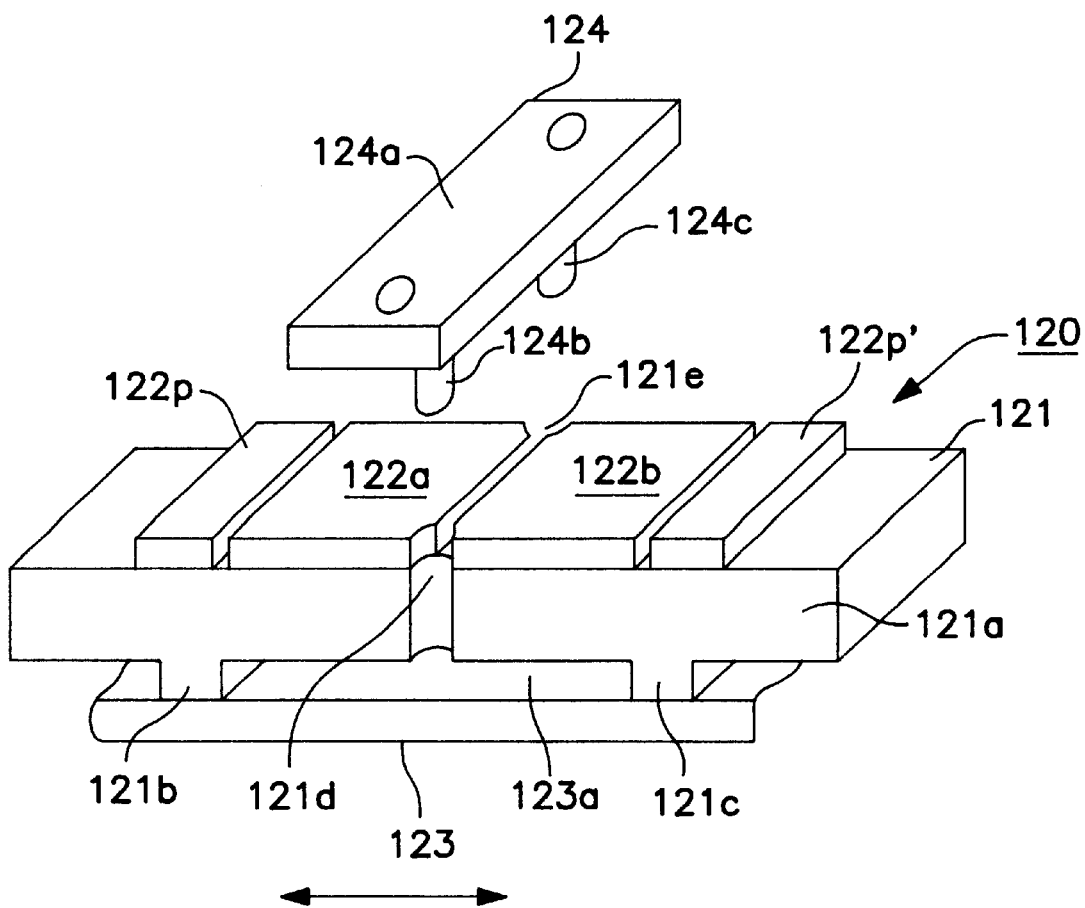
FIG. 14 is a perspective view showing a conventional a vibration actuator using both longitudinal and bending vibrations.

FIG. 13 is a block diagram of a drive circuit of the ultrasonic actuator in accordance with the sixth embodiment of the invention. The drive circuit comprises an oscillator 60, a phase shifter 61, two amplifiers 62a and 62b, and a control circuit 63. The oscillator 60 may comprise, for example, a voltage controlled oscillator (VCO), generating an alternating voltage having a frequency based on the target velocity of the ultrasonic actuator. The alternating voltage generated by the oscillator 60 is branched to both the phase shifter 61 and to the amplifier 62a.

The phase shifter 61 changes the phase of the input alternating voltage by ($\pi/2$) and outputs the phase shifted voltage to the amplifier 62b. The amplifier 62a amplifies the alternating voltage from the oscillator 60 to produce the first alternating voltage. The first alternating voltage is branched in two and provided to the electrode 12a and to the electrode 12c. The amplifier 62b amplifies the alternating voltage from the phase shifter 61 to produce the second alternating voltage. The second alternating voltage is branched in two and provided to the electrode 12b and to the electrode 12d. As shown in FIG. 9B, a first order longitudinal vibration (first vibration) in the direction of the relative movement (lateral direction in FIG. 9), and a fourth order bending vibration (second vibration) in a direction intersecting the direction of the relative movement, are generated synchronously. The first and second vibrations are combined to produce an elliptical movement of the driving force output members 14a–14d. As a result, the relative movement member 41 that contacts the driving force output members 14a–14d moves either to the left or right in FIG. 9. To switch the direction of movement of the relative movement member 41, the sign for the phase changed by the phase shifter 61 may be reversed, for example, to (−π/2).

The output voltages from the electrodes 12e and 12f are provided to the control circuit 63. The output voltage has a value proportional to the size of the amplitude of the vibration member 110-A. The control circuit 63 compares a predetermined reference voltage and the output voltage from the electrodes 12e, 12f. If the outputs from the electrodes 12e and 12f are less than the predetermined voltage, the control circuit 63 controls the oscillator 60 so that the frequency of the first and second alternating voltages approaches the resonance frequency of the first order longitudinal vibration and the fourth order bending vibration of the vibration member 10-A. On the other hand, if the outputs from electrodes 12e and 12f are greater than the predetermined voltage, the control circuit 63 controls the oscillator 60 so that the frequency of the first and second alternating voltages become farther from the resonance frequency of the first order longitudinal vibration and the fourth order bending vibration of the vibration member 10-A. Thus, the amplitude of the vibration of vibration member 10-A is maintained at a certain level.

The drive circuit 63 in FIG. 13 may also be used also as a circuit to drive the vibration member 10 shown in FIG. 1.

The casing 71 will now be described below. The casing 71 is a base to support the vibration member 10-A. As shown in FIG. 9A, the casing 71 is a box-like case with an open front. Grooves 71a and 71b are provided on each of the opposing sides of the casing 71 through which the relative movement member 41 passes. Transfer rollers 79a and 79b are provided inside the casing 71 to transfer the relative movement member 41. Both of the transfer rollers 79a and 79b are supported to allow their rotational movement. As shown in FIG. 12, the transfer rollers 79a and 79b contact relative movement member 41 at two points.

The configuration of supporting member 70 will now be described below. The supporting member 70 comprises a first position restricting member 72, a second position restricting member 73, a restricting pin 74, a coil spring 75, a block 76 for pressing, a plate spring 77, and a block 78 for securing the plate spring 77.

The first position restricting member 72 and the second position restricting member 73 prevent the vibration member 10-A from rolling when the relative movement member 41 moves. The of the first and second position restricting members 72, 73 preferably comprise polyacetal resin. As shown in FIG. 9A, the first position restricting member 72 is secured with two screws 81 to a frame part 71c in the upper front section of the casing 71. Furthermore, the second position restricting member 73 is, as shown in FIG. 10A, secured to an end wall 71d of the casing 71 with two screws 82. In FIG. 11, screw holes for screws 81 and 82 are omitted along with the first position restricting member 72 and the second position restricting member 73. As shown in FIG. 11, two protrusions 72a and 72b are created on the first position restricting member 72 along the transversal direction of the vibration member 11-A. Similarly, two protrusions 73a and 73b are created on the second position restricting member 73 along the transversal direction of the vibration member 11-A.

A retaining member 80, preferably made of urethane rubber, is provided at the end of the four protrusions 72a, 72b, 73a and 73b. The protrusion 72a on the first position restricting member 72 is provided at a location corresponding to the node B4b of the fourth order bending vibration occurring in the vibration member 10-A (elastic member 11-A) when the first position restricting member 72 is secured to the casing 71. The retaining member 80 provided at the end of the protrusion 72a contacts the elastic member 11-A at a location on one side of the elastic member 11-A which is also the location of the node B4b of the fourth order bending vibration. Moreover, the protrusion 72b is provided at a location corresponding to the node B4d of the fourth order bending vibration occurring in the vibration member 10-A (elastic member 11-A) when the first position restricting member 72 is secured to the casing 71. The retaining member 80 provided at the end of the protrusion 72b contacts the elastic member 11-A at a location on one side of elastic member 11-A which is also the location of the node B4d of the fourth order bending vibration. The protrusion 73a is provided at a location corresponding to the node B4b of the fourth order bending vibration occurring in vibration member 10-A (elastic member 11-A) when the second restricting member 73 is secured to the casing 71. The retaining member 80 provided at the end of the protrusion 73a contacts the elastic member 11-A at a location on one side of the elastic member 11-A and which is also the location of the node B4b of the fourth order bending vibration. The protrusion 73b is provided at a location corresponding to the node B4d of the fourth order bending vibration occurring in the vibration member 10-A (elastic member 11-A) when the second restricting member 73 is secured to the casing 71. The retaining member 80 provided at the end of the protrusion 73b contacts the elastic member 11-A at a location on one side of elastic member 11-A and which is also the location of the node B4d of the fourth order bending vibration.

The distance between the retaining member 80 provided at the end of the protrusion 72a and the retaining member 80 provided at the end of the protrusion 73a, is shorter, by a specified length, than the length W in the transversal direction of the elastic member 11-A. Similarly, the distance between the retaining member 80 provided at the end of the protrusion 72b, and retaining member 80 provided at the end of protrusion 73b, is also shorter, by a specified length, than the length W in the transversal direction of the elastic member 11-A. As a result, each retaining member 80 is compressed between protrusions and elastic member 11-A, thereby providing a specified amount of pressing force toward the sides of the vibration member 10-A.

The retaining member 80 contacts the vibration member 10-A at a location other than a node of the longitudinal vibration occurring in the vibration member 10-A, thereby causing the longitudinal vibration to decrease. In accordance with the sixth embodiment of the present invention, with the use of urethane rubber for the retaining member 80, the decrease in the longitudinal vibration is controlled as the urethane rubber follows the expansion and contraction vibration of the elastic member 11-A. As described hereinabove, the urethane rubber also provides the energy imparting force toward the sides of the vibration member 10-A. Although the retaining member 80 is preferably urethane rubber, other rubber materials, such as silicone rubber or butadiene rubber, may be used instead of urethane rubber. Further, the retaining member 80 may be a soft resin instead of rubber. If a resin is used as the retaining member 80, a plate spring, or a coil spring, may press the retaining member 80 against the side of the vibration member 10-A with a specified force to provide the pressing force.

The main bodies of the first position restricting member 72 and the second position restricting member 73 are preferably made of materials having a higher capacity to attenuate the vibration. Thus, resin materials are preferred over metal materials. Among resins, a material having a higher rigidity is preferred. If a metal material is used as the restricting members 72, 73, the respective restricting members 72, 73 resonate at their own characteristic frequency, often causing noises. Alternatively, if a resin material is used as the restricting members 72, 73, the capacity to attenuate the vibration increases and it is suitable for preventing the noises. In accordance with the sixth embodiment of the present invention, polyacetal resin is preferably used as the restricting member 72, 73; however, other materials, such as methacrylate plastics, phenol resin, fluoroplastic, acrylonitrile-butadiene-styrene resin (ABS resin), polyamide, polyimide, polyethylene, polyvinylchloride, polypropylene, polystyrene, epoxy resin, or polycarbonate, may be used. For example, polyamide, nylon 6 or nylon 66 may be used. Further, for example, fluoroplastic, PTFE (plytetrafluoroethylene) or FEP(fluoroethylenepropylene) may be used. These resins may be used alone, or combined.

In accordance with the sixth embodiment of the present invention, at the location of the node B4$b$ of the bending vibration, the vibration member 10-A is laterally placed between retaining members 80 that are provided at protrusions 72$a$ and 73$a$. Further, at the location of the node B4$d$ of the bending vibration, the vibration member 10-A is also laterally placed between the retaining members 80 provided at protrusions 72$b$ and 73$b$. As a result, it is possible to prevent the vibration member 10-A from rolling when relative movement member 41 moves. Thus, in accordance with the sixth embodiment of the invention, each retaining member 80 makes contact with the vibration member 10-A at the location of a node of the bending vibration, thereby preventing the attenuation of the bending vibration occurring in the vibration member 10-A. On the other hand, the retaining member contacts 80 the vibration member 10-A at a location other than the node of the vibration during the longitudinal vibration occurring in the vibration member 10-A. This may cause a decrease in the longitudinal vibration; however, as for the direction of the longitudinal vibration occurring in the vibration member 10-A, each retaining member merely contacts the side of the vibration member 10-A with a specified pressing force and does not restrict the movement thereof.

Furthermore, because the retaining member 80 is made of rubber or other soft, resilient resin materials, the attenuation in the longitudinal vibration occurring in the vibration member 10-A may be minimized. Furthermore, it is unnecessary to set the contact point between the retaining member 80 and the vibration member 11-A precisely at the node B4$b$ or B4$d$ of the bending vibration and the contact point may be set in the vicinity of the nodes B4$b$ or B4$d$.

The restricting pin 74 comprises a restricting pin 74$a$ that is inserted in the notch 55$a$ provided on the elastic body 11-A, and a restricting pin 74$b$ that is inserted in the notch 55$b$. The restricting pin 74$a$ is inserted into a pass through hole 76a provided in pressing block 76. The restricting pin 74$b$ is inserted into a pass through hole 76b provided in the pressing block 76. The restricting pins 74$a$ and 74$b$ are loosely inserted in notches 55$a$ and 55$b$, respectively. On the other hand, the restricting pins 74$a$, 74$b$ are strongly secured to the pressing block 76 using adhesive. The pressing block 76 is secured to one end of the plate spring 77 with the screw 84. The other end of the plate spring 77 is secured to a plate spring securing block 78 with the screw 85. The plate spring securing block 78 is secured within casing 71 with two screws 83. Therefore, as the restricting pin 74 is inserted in the notches 55$a$ and 55$b$ of the elastic member 11-A, the relative positions of the vibration member 10-A and the casing 71 are set with respect to the direction of transferring the relative movement member 41 (transversal direction of elastic member 11-A). In other words, the restricting pin 74 functions as the first position determining member to restrict the shifting of the relative position of the vibration member 10-A and supporting member 70 with respect to the direction of the relative movement. Furthermore, because the plate spring 77 can also bend in the vertical directions in FIGS. 9 and 10, the pressing block 76 can also yield in the vertical directions in the figures when it receives the spring force generated by the coil spring 75, which will be addressed later.

In accordance with the sixth embodiment of the present invention, semi-circular notches 55$a$ and 55$b$ are provided opposing sides of the center, respectively, in the transversal direction of the vibration member 10-A (location B4$c$, which is a node of the first order longitudinal vibration occurring in the vibration member 10-A), and the restricting pin 74 is inserted in the notches 55$a$ and 55$b$. However, it is unnecessary to set the position of vibration member 10-A using the restricting pin 74 to be precisely at the node B4$c$ of the first order longitudinal vibration, and the vicinity of node B4$c$ is also acceptable.

The coil spring 75 is disposed between the ceiling of the casing 71 and the pressing block 76. The coil spring 75 presses the pressing block 76 toward the vibration member 10-A with the generated spring force. The coil spring 75 includes a screw mechanism 75$a$ for adjusting the applied pressing force between the vibration member 10-A and the relative movement member 41. The screw mechanism 75$a$ is provided at the ceiling of the casing 71 that contacts the coil spring 75. The length of the coil spring 75 may be altered by changing the fastening location of the screw mechanism 75$a$. Accordingly, the spring force generated by the coil spring 75 is adjusted, thereby enabling adjustment to be made to the applied pressing force.

A total of four protrusions 76$c$, 76$d$, 76$e$, and 76$f$ are created on the pressing block 76 on a plane juxtaposed with the vibration member 10-A. The protrusions 76$c$ and 76$d$ contact the vibration member 10-A at the location of the node B4$b$ of the fourth order bending vibration, which is on the upper surface of the vibration member 10-A. The protrusions 76$e$ and 76$f$ contact the vibration member 10-A at the location of the node B4$d$ of the fourth order bending vibration, which is also on the upper surface of vibration member 10-A. A space between the protrusion 76$c$ and the protrusion 76$d$, and a space between the protrusion 76$e$ and the protrusion 76$f$, are provided to avoid a soldered area that connects each electrode of the piezoelectric member 12 and a lead line (not shown).

However, it is unnecessary to set the contact location of protrusions 76$c$–76$f$ and the vibration member 10-A to be precisely at the node B4$b$ or B4$d$ of the fourth order bending vibration. For example, the contact location may be set in the vicinity of the node B4$b$ or B4$d$. Moreover, a resin coating may be applied to the end of the protrusions 76$c$–76$f$ to prevent a short circuit between the protrusions and the piezoelectric members 12. By the application of the spring force generated by the coil spring 75, the pressing block 76 shifts toward the vibration member 10-A side due to the bending of the plate spring 77. As a result, the pressing block 76 presses the vibration member 10-A against the relative movement member 41.

A procedure for assembling the ultrasonic actuator in accordance with the sixth embodiment of the present invention will now be described below.

Firstly, the second position restricting member 73 is secured to the end wall 71d of the casing 71 using two screws 82. The relative movement member 41 is then inserted toward the direction of transfer from one side of the grooves 71a and 71b provided on the casing 71 to load the relative movement member 41 on transfer rollers 79a and 79b. Next, the restricting pins 74a and 74b are secured to the pressing block 76. The pressing block 76 is then integrated with the plate spring 77 and the plate spring securing block 78 using screws 83 and 85. The coil spring 75 is the mounted on the screw mechanism 75a.

The vibration member 10-A is then placed between the relative movement member 41 and the pressing block 76. The plate spring securing block 78 is secured to the casing 71 with the screw 83 while maintaining restricting pin 74b that is loosely fit into the notch 55b. At this time, the plate spring securing block 78 is secured in such a manner that the driving force output members 14a–14d of the vibration member 10-A contact the relative movement member 41, and coil spring 75 is located between the plate spring 77 and the ceiling of the casing 71.

Finally, the first restricting member 72 is secured to the casing 71 with the screw 81.

In an ultrasonic actuator assembled in the above-described manner, the position of vibration member 10-A and the casing 71 with respect to the direction of transfer is set by restricting pins 74a and 74b. Moreover, the position of the vibration member 10-A and the casing 71 in the lateral direction with respect to the direction of transfer is set by first position restricting member 72 and the second position restricting member 73.

When the ultrasonic actuator is driven, the first alternating voltage is applied to the electrodes 12a and 12c of the piezoelectric member 12 and the second alternating voltage is applied to the electrodes 12b and 12d. As a result, a first order longitudinal vibration in the direction of the relative movement and a fourth order bending vibration in the direction intersecting the direction of the relative movement are generated in the vibration member 10-A. Accordingly, an elliptical movement is generated in the driving force output members 14a–14d, and the relative movement member 41 moves either left or right in FIG. 9.

At this time, a force causing the vibration member 10-A to roll in the lateral directions with respect to the direction of transfer is produced on the vibration member 10-A. Nevertheless, the rolling rarely occurs in the vibration member 10-A because both sides of the vibration member 10-A are restrained by the first position restricting member 72 and the second position restricting member 73 at two locations. Thus, noise and unnecessary vibration may be prevented, and the drive efficiency positioning accuracy, and responsiveness of the ultrasonic actuator are improved.

In accordance with the first through fourth embodiments described above, it is preferable to use resins for the areas of the first, second, and third position determining members that contact the elastic member to control the generation of noise more effectively.

In accordance with the first through sixth embodiments described above, the vibration member has been described as being secured while the relative movement member moves. However, the present invention is not limited to the vibration member being secured while the relative movement member moves. For example, a fixed member such as a rail, may be used as a securing member to allow the vibration member and the base to move with respect to the securing member. In this case, the supporting member determines the position of the vibration member with respect to the base.

In accordance with the embodiments of the invention described hereinabove, the vibration actuator has been described with reference to an ultrasonic actuator that uses an ultrasonic vibration range. However, the embodiments of the present invention may also be applied to a vibration actuator that uses other vibration ranges.

Embodiments of the present invention have been described with reference to a standing wave type vibration actuator using a first order longitudinal vibration and a fourth order bending vibration. However, the present invention is not limited to this. For example, embodiments of the present invention may be applied to a vibration actuator that is driven based upon other principles, such as the use of a first order longitudinal vibration and a second order bending vibration.

Moreover, in accordance with embodiments of the present invention, piezoelectric members are used as electromechanical converting elements. However, electrostriction or magnetostriction elements may be substituted for piezoelectric members.

In accordance with embodiments of the present invention shown in FIGS. 1–7, a plate spring or coil spring was used as a position determining press member. However, the present invention is not limited to use of a plate spring or a coil spring. For example, other types of springs, or other non-spring members that exhibit resilience, such as rubber or sponge, may also be used. Furthermore, it is also acceptable to have these members, or rubber, directly contact the elastic member for the position determining press member to function as the third position determining member as well. In this case, an insulating member is provided in an area that contacts the elastic member to prevent a short circuit if the position determining press member is made of a conducting material such as a metal.

In accordance with embodiments of the present invention described hereinabove, the generation of noise and unnecessary vibration caused by the vibration actuator can be prevented. Furthermore, the drive efficiency, positioning accuracy, and responsiveness of the vibration actuator are improved.

Although a few preferred embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A vibration actuator, comprising:
   a vibration member to generate vibration, the vibration member having a specified plane and is in contact with a relative movement member in the specified plane, wherein the vibration of the vibration member generates relative motion between the vibration member and the relative movement member;
   a first pressing member to press in a first pressing direction to cause the vibration member and the relative movement member to come in contact; and
   a supporting member to support the vibration member, the supporting member including a plurality of position determining members contacting the vibration member at different locations, at least one of the plurality of position determining members presses in a second direction substantially perpendicular to the first pressing direction.

2. A vibration actuator as recited in claim 1, wherein the vibration member further comprises:

a first plane having two sides along the direction of the relative motion, and an engaging section on one of the two sides of the first plane, and the plurality of position determining members comprise a first position determining member contacting the vibration member at the engaging section, a second position determining member contacting the vibration member at a location different from that of the first position determining member, and a third position determining member including an elastic member and contacting the vibration member, through an elastic force of the elastic member, at a side opposite the engaging section and at a location different from that of the second position determining member.

3. A vibration actuator as recited in claim 1, wherein at least one of the plurality of position determining members contacts the vibration member at a location of a node of the vibration occurring in the vibration member.

4. A vibration actuator as recited in claim 1, wherein the vibration member generates a first order longitudinal vibration and a fourth order bending vibration, and at least one of the plurality of position determining members contacts the vibration member at a location of a node of the fourth order bending vibration.

5. A vibration actuator as recited in claim 1, wherein the plurality of position determining members include at least three position determining members.

6. A vibration actuator as recited in claim 4, wherein each of the plurality of position determining members contacts the vibration member at a location of a node of the fourth order bending vibration.

7. A vibration actuator as recited in claim 4, wherein at least one of the plurality of position determining members contacts the vibration member at an approximate location where a node of the first order longitudinal vibration and a node of the fourth order bending vibration meet.

8. A vibration actuator as recited in claim 2, wherein the first position determining member restricts the movement of the vibration member in a direction of the relative motion with respect to the supporting member, and the second position determining member and the third position determining member do not restrict the movement of the vibration member.

9. A vibration actuator as recited in claim 2, wherein the first plane is approximately perpendicular to the first pressing direction.

10. A vibration actuator as recited in claim 9, wherein neither the first, second, nor third position determining member restricts the movement of the vibration member in the first pressing direction.

11. A vibration actuator as recited in claim 1, wherein the plurality of position determining members comprise a first position determining member to restrict a change in the relative position between the vibration member and the supporting member with respect to the direction of the relative motion, a position determining press member to press the vibration member from a direction intersecting the first pressing direction; and a second position determining member to restrict the movement of the vibration member caused by the position determining press member in a direction intersecting the first pressing direction.

12. A vibration actuator as recited in claim 1, wherein the plurality of position determining members comprise:

a first position determining member to restrict a change in the relative position of the vibration member and the supporting member with respect to a direction of the relative motion;

a rotational moment generating member to generate a rotational moment around the first position determining member through a pressing force generated by the at least one of the plurality of position determining members; and a second position determining member to restrict the rotation of the vibration member caused by the rotational moment around the position determining member.

13. A vibration actuator as recited in claim 1, wherein the vibration member generates a first vibration in a direction approximately parallel to the direction of the relative motion, and a second vibration in a direction approximately perpendicular to the direction of the first vibration;

the supporting member further includes a restricting member to restrict the movement of the vibration member in a direction approximately perpendicular to directions of both the first and second vibrations; and at least one of the position determining members comprises at least a part of the restricting member and presses in the second direction.

14. A vibration actuator as recited in claim 13, wherein the restricting member contacts the vibration member so that the vibration member is able to move in the directions of the first and second vibrations.

15. A vibration actuator as recited in claim 13, wherein the restricting member is formed of materials comprising at least one of polyacetal resin, methacrylate plastics, phenol resin, polyamide, fluoroplastics, acrylonitrile-butadiene-styrene resin, polyimide, polyethylene, polyvinylchloride, polycarbonate, polypropylene, polystyrene, and epoxy resin.

16. A vibration actuator, comprising:

a vibration member to generate vibration, the vibration member having a specified plane and is in contact with a relative movement member in the specified plane, wherein the vibration of the vibration member generates relative motion between the vibration member and the relative movement member; and a supporting member to support the vibration member, wherein the vibration member generates a first vibration in a direction approximately parallel to the direction of relative motion, and a second vibration in a direction approximately perpendicular to the direction of the first vibration, the supporting member includes restricting members to restrict the movement of the vibration member in a direction approximately perpendicular to the respective directions of both the first and second vibrations, and each of the restricting members restricts the vibration member at different positions of a side surface of the vibration member, and at least one of the restricting members restricts the vibration member at a position other than a center of a length of the vibration member.

17. A vibration actuator as recited in claim 16, wherein the restricting members contact the vibration member on at least three different points, and at least one of the contact points presses the vibration member in a direction approximately perpendicular to the respective directions of both the first and second vibrations.

18. A vibration actuator as recited in claim 16, wherein the restricting members are formed of materials comprising at least one of polyacetal resin, methacrylate plastics, phenol resin, polyamide, fluoroplastics, acrylonitrile-butadiene-styrene resin, polyimide, polyethylene, polyvinylchloride, polycarbonate, polypropylene, polystyrene, and epoxy resin.

19. A vibration actuator as recited in claim 16, wherein the supporting member further comprises:

a first position determining member to restrict a change in the relative position of the vibration member and the supporting member with respect to the direction of relative motion, and the first position determining member contacts the vibration member at a node of the first vibration, and one of the restricting members contacts the vibration member at a location of a node of the second vibration.

20. A vibration actuator as recited in claim 16, wherein the vibration member includes a notch at a location of a node of the first vibration, the supporting member further includes a first position determining member to engage with the notch to restrict shifting of the relative position of the vibration member and the supporting member with respect to the direction of the relative motion, and the restricting members contact the vibration member at two different locations, one each on both of the two sides along the direction of the relative motion of the vibration member.

21. A vibration actuator as recited in claim 19, wherein the first position determining member and the restricting members allow either of the contact points with the vibration member to contact the vibration member in a manner that the vibration member moves in a direction of the second vibration.

22. A vibration actuator as recited in claim 20, wherein the first position determining member and the restricting members allow either of the contact points with the vibration member to contact the vibration member in a manner that the vibration member moves in a direction of the second vibration.

* * * * *